(12) United States Patent
Miller

(10) Patent No.: US 6,416,880 B1
(45) Date of Patent: Jul. 9, 2002

(54) AMORPHOUS PERMALLOY FILMS AND METHOD OF PREPARING THE SAME

(75) Inventor: Mark S. Miller, Edina, MN (US)

(73) Assignee: Seagate Technology, LLC, Scotts Valley, CA (US)

(*) Notice: Subject to any disclaimer, the term of this patent is extended or adjusted under 35 U.S.C. 154(b) by 0 days.

(21) Appl. No.: 08/211,157
(22) PCT Filed: Dec. 9, 1993
(86) PCT No.: PCT/US93/11968
§ 371 (c)(1),
(2), (4) Date: Mar. 17, 1994
(87) PCT Pub. No.: WO95/16268
PCT Pub. Date: Jun. 15, 1995

(51) Int. Cl.$^7$ .......................... B32B 15/18; C23C 14/34; G11B 5/851; G11B 5/31
(52) U.S. Cl. ........................ 428/611; 428/680; 428/928; 428/938; 360/113; 204/192.2
(58) Field of Search ............................ 428/611, 928, 428/680, 681, 938; 148/304, 403; 360/113; 204/192.11, 192.2

(56) References Cited

U.S. PATENT DOCUMENTS

| | | | |
|---|---|---|---|
| 3,965,463 A | | 6/1976 | Chaudhari et al. ..... 340/174 TF |
| 4,158,213 A | * | 6/1979 | Griffith ................. 360/121 |
| 4,231,816 A | | 11/1980 | Cuomo et al. .......... 148/31.55 |
| 4,251,910 A | * | 2/1981 | Griffith ................. 29/603 |
| 4,604,176 A | | 8/1986 | Paul ................. 204/192 M |
| 4,642,270 A | * | 2/1987 | Morita ................. 428/621 |
| 4,751,142 A | | 6/1988 | Arimune et al. .......... 428/336 |
| 4,768,121 A | * | 8/1988 | Nakashima et al. ....... 360/125 |
| 4,865,658 A | | 9/1989 | Kudo ................. 148/121 |
| 4,878,290 A | | 11/1989 | Masud et al. ........... 29/603 |
| 5,051,856 A | | 9/1991 | Narishige et al. ........ 360/126 |
| 5,068,050 A | | 11/1991 | Inomata et al. ......... 252/62.51 |
| 5,145,555 A | | 9/1992 | Yamamoto ............. 156/643 |
| 5,153,044 A | | 10/1992 | Chen et al. ............ 428/64 |
| 5,181,020 A | | 1/1993 | Furukawa et al. ........ 348/51 |

OTHER PUBLICATIONS

Takahashi et al., "Fabrication and Magnetic Properties of Thin Films Sputtered on the Substrate Excited by SAW", IEEE Translation Journal on Magnetics in Japan, vol. 6, No. 2, February 1991, New York, NY.

Nagai et al., "Ion bombardment effect on preferred orientation in Ni–Fe film formed by ion beam sputtering", Journal of Vacuum Science & Technology, 1987 Jan–Feb., No. 1, Second Series, New York, NY.

Freeman, "Effect of deposition conditions on the properties of thin permalloy film", Journal of Vacuum Science & Technology, 1991 May–Jun, No. 3, Part I, New York.

Oliver et al., "Magnetic and Microwave Resonance Characterization of Ion Beam Sputtered Amorphous $Fe_rNi_{80-r}B_{15}Si_5$ Films", IEEE Transactions on Magnetics, 1989 Sep., No. 5, New York.

Chi et al., The magnetoresistivity, structure, and magnetic anisotropy of RF sputtered and E–beam evaporated NiFe films, Journal of Applied Physics, vol. 52, Mar. 1981, No. 3, Part II, New York.

Christopher V. Jahnes et al., *Ion Beam Sputter Deposited Permalloy Thin Films*, IEEE Transactions on Magnetics, vol. 28, No. 4, Jul. 1992, pp. 1904–1910.

Jerry Lo et al., *Magnetic and Structural Properties of High Rate Dual Ion–Beam Sputtered FiFe Films (invited)*, J. Appl. Phys., vol. 61, No. 8, Apr. 15, 1987, pp. 3520–3525.

C. Nishimura et al., *Properties of Ion–Beam–Sputtered Ni–Fe Films*, Musashino Electrical Communication Lab. NTT, pp. 1–17, No date.

\* cited by examiner

*Primary Examiner*—John J. Zimmerman
(74) *Attorney, Agent, or Firm*—Kinney & Lange (57) ABSTRACT

A magnetically permeable material comprising a substantially amorphous permalloy film is disclosed. The substantially amorphous permalloy film is formed by ion-beam sputtering. The substantially amorphous permalloy film exhibits improved output amplitude and noise characteristics.

15 Claims, 7 Drawing Sheets

AMORPHOUS PERMALLOY FILMS AND METHOD OF PREPARING THE SAME

This application was filed under 35 U.S.C. 371 from PCT/US93/11968 filed Dec. 9, 1993.

BACKGROUND OF THE INVENTION

The present invention relates to permalloy films and more particularly to an amorphous permalloy film which can be used in magnetic recording systems.

A recent trend in magnetic storage system design is the use of magneto-resistive (MR) heads to read data from a magnetic storage medium in a magnetic storage device. Use of MR heads, instead of inductive sensor heads, has enabled manufacturers to increase recording densities in magnetic storage systems. Various materials and methods of fabricating thin films from these materials are being used to produce MR heads which can be used to meet the higher recording density requirements which will be needed in future magnetic storage systems.

Permalloy is a name for any of a large number of highly magnetically permeable alloys containing a combination of nickel and iron. Permalloy is frequently used as magnetic circuit material for applications such as thin film MR heads because of its high magnetic permeability and its superior frequency characteristics. Specifically, permalloy has been used as a thin film magneto-resistive element (MRE) in MR heads. The MRE of a thin film MR head is the portion which exhibits a change in resistance as it passes through magnetic fields emanating from the magnetic storage media and other favorable magnetic and electrical properties.

Although many magnetic films are currently made from permalloy, other types of materials are also frequently used. For example, amorphous materials have been used to make magnetic thin films because of their advantageous properties, particularly with regard to magnetic properties. These amorphous materials usually have naturally occurring amorphous or nearly amorphous crystalline structures. Examples of naturally occurring amorphous materials used in thin film magnetic heads includes CoZr, CoZrRh, and CoZrNb. These essentially amorphous materials are frequently used in thin film magnetic heads because of their high magnetic permeability and other favorable magnetic and electrical properties.

Ion-beam sputtering is a technology which is being increasingly used in the deposition of thin films, and particularly in the deposition of MREs for MR head magnetic storage devices. Ion-beam sputtering deposition techniques employ collimated beams of nearly monoenergetic ions which are directed and focused onto a target up to 60 cm (24 inches) away from the source of ion generation. The large separation distance between the target and the ion or plasma generation region allows ion-beam sputtering to be conducted at significantly lower pressures than other standard sputtering techniques such as rf-diode sputtering techniques. The lower pressures translate to fewer collisions between ions in the ion-beam and gas molecules before the ions collide with the target. This results in higher energy films. The reflection of ions and neutrals from the target also helps increase energy levels of the thin films fabricated using ion-beam sputtering techniques. Consequently, ion-beam sputtered thin films exhibit higher densities, improved corrosion resistance, reduced impurity levels and altered stresses in comparison to films sputtered under standard techniques such as rf-diode sputtering.

Ion-beam sputtering has been used in various thin film applications such as optical coatings, fabrication of magneto-optic media and fabrication of MR heads. Ion-beam sputtered MREs have shown higher outputs and greater corrosion resistance than rf-diode sputtered MREs.

Ion-beam techniques have been used to deposit a number of different thin film materials. For example, high permeability amorphous materials such as CoZr, CoZrRh and CoZrNb have been successfully deposited by ion-beam sputtering techniques. Additionally, ion-beam sputtering of permalloy, or $Ni_xFe_{1-x}$, has been used to obtain permalloy films with improved characteristics. Several articles have been written on the properties of ion-beam sputtered permalloy films.

A first article, by Jerry Lo et al., is entitled "Magnetic and Structural Properties of High Rate Dual Ion-Beam Sputtered NiFe Films", Journal of Applied Physics, Vol. 61, No. 8, Apr. 15, 1987. In this article, the authors noted that by varying the target angle relative to the substrate surface, the magnetic properties of the Ni—Fe films can be altered. The authors also found that no significant changes in magnetic and electrical properties were observed in films deposited with beam voltages between 200 and 2,000 V (beam energies between 200 and 2,000 electron-volts). This article also discussed the results of adding nitrogen to the sputtering process to reduce the x-ray diffraction <111> peak. Ultimately, the authors concluded that, in the case of sputtering without the addition of nitrogen, the x-ray diffraction <111> peak intensity remained relatively constant for diffraction angles of less than 45°, and that this implies that the Ni—Fe films with diffraction angles of less than 45° have similar <111> textures.

A second article, by Christopher V. Jahnes et al., is entitled "Ion Beam Sputter Deposited Permalloy Thin Films", IEEE Transactions on Magnetics, Vol. 28, No. 4, July 1992. In this article, the authors describe the ion-beam sputtering procedures used in their research and discuss the properties of the resulting ion-beam sputter deposited permalloy films. The authors of that paper noted that, under certain conditions, ion-beam sputtering could be used to deposit permalloy films with characteristics suitable for use in thin film heads. In this article, the authors made a number of observations concerning ion-beam sputtered permalloy films. One important observation was that there is little change in the magnetic properties of ion-beam deposited films as a function of the film deposition rate which is dependent upon the energy level of the ion beam.

A third article, by G. C. Chi et al. is entitled "The magnetoresistivity, structure, and magnetic anisotropy of RF sputtered and E-beam evaporated NiFe films", Journal of Applied Physics, Vol. 52, No. 3, March 1981. In this article, the authors describe the differing structural and magnetic properties of NiFe films formed by RF sputtering and E-beam evaporation. The use of permalloy thin films as bubble detectors is mentioned.

A fourth article, by M. Takahashi et al. is entitled "Fabrication and Magnetic Properties of Thin Films Sputtered on the Substrate Excited by SAW", IEEE Translation Journal on Magnetics in Japan, Vol. 6, No. 2, February 1991. In this article, the authors describe the deposition of NiFe films by d.c. magnetron sputtering onto substrates excited by surface acoustic waves. The author found that the physical structure of the film could be made to change dramatically as a function of the excitation amplitude of the surface acoustic waves and that these structural changes altered the magnetic properties of the film.

As recording density requirements continue to increase, magnetic thin films with improved magnetic and electrical properties must be found in order to manufacture MR heads capable of meeting these increasing density requirements. Use of materials such as permalloy films and/or naturally occurring amorphous films must be further developed to achieve higher recording capabilities.

SUMMARY OF THE INVENTION

The present invention is based upon the recognition that a thin magnetic film with the desirable magnetic and electrical properties of permalloy films and with increased digital and analog output amplitudes provides an important tool in the design of magnetic storage and recording systems capable of meeting the high density requirements needed for the future. An amorphous or substantially amorphous permalloy film with magnetic and electrical properties similar to magnetic and electrical properties of nonamorphous permalloy films, but with improved output amplitude and noise characteristics, provides a magnetic material which can be used to achieve the desired increased recording densities.

The present invention is a permalloy film with an amorphous or substantially amorphous crystalline film structure. The permalloy film, which has an atomic composition comprising a combination of nickel and iron, is substantially amorphous in the face centered cubic <111> plane, with the face centered cubic <111> plane lying substantially parallel to the surface of a substrate. In preferred embodiments of the present invention, the substantially amorphous permalloy film has a composition which includes between 30 and 86 percent nickel.

In some preferred embodiments of the present invention, the substantially amorphous permalloy film is formed by ion-beam sputtering. The ion-beam sputtering is, in preferred embodiments, conducted with ion-beam energies below 500 electron-volts. In at least one preferred embodiment, the substantially amorphous permalloy film is formed by ion-beam sputtering with ion-beam energies of approximately 300 electron-volts. In another preferred embodiment, the substantially amorphous permalloy film is formed by ion-beam sputtering with an angle of incidence between the ion-beam and a permalloy target of approximately 30°.

In some preferred embodiments, the substantially amorphous permalloy film of the present invention is used as a magneto-resistive element in a magneto-resistive head. In these preferred embodiments, magneto-resistive elements comprised of the amorphous permalloy films exhibit improved output amplitude and noise characteristics.

DETAILED DESCRIPTION OF THE PREFERRED EMBODIMENTS

A. Overview of Magneto-Resistive Heads

Figure 1:
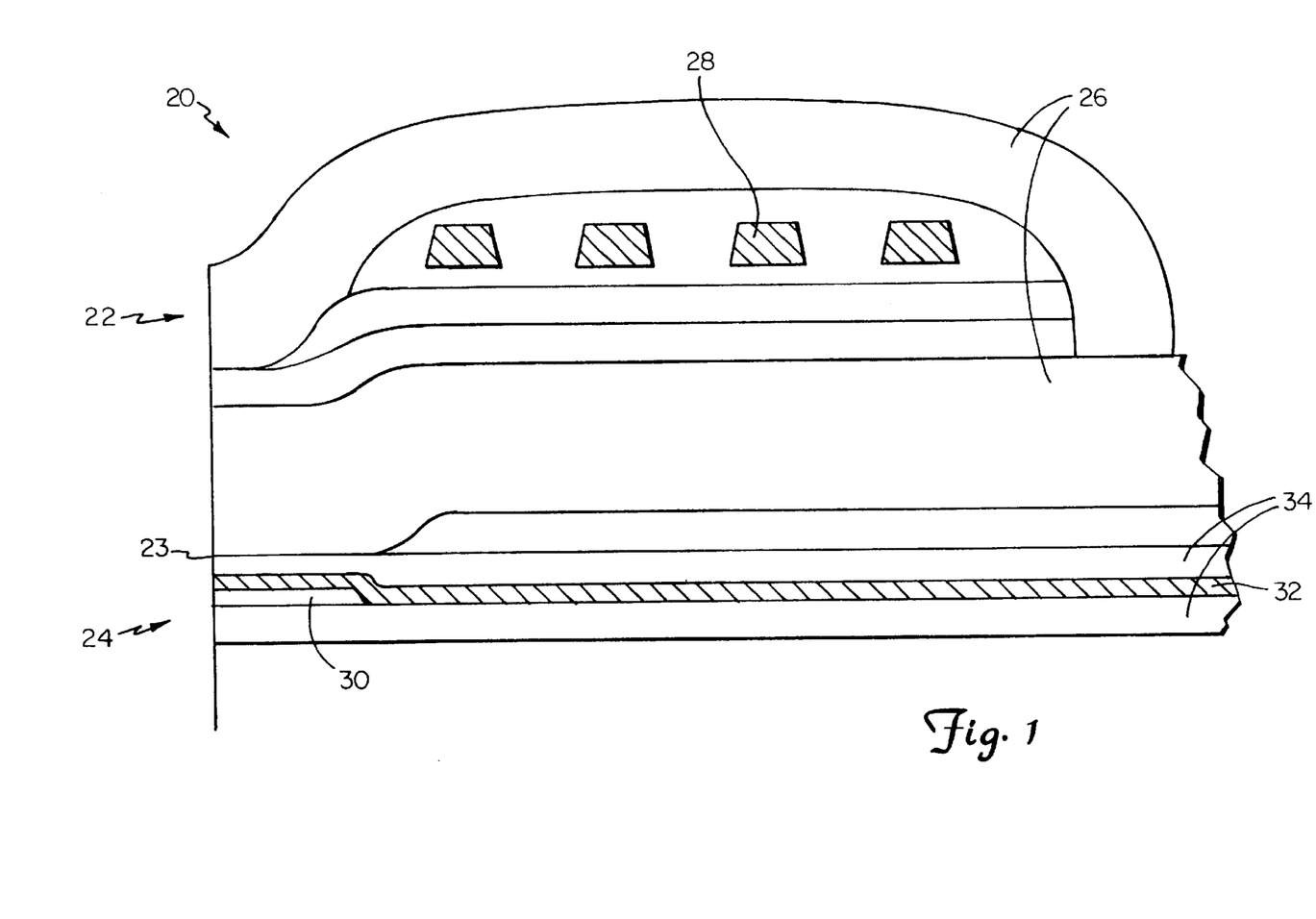
FIG. 1 is a sectional view of a magneto-resistive head with a magneto-resistive element which may incorporate the permalloy films with substantially amorphous crystalline structures of the present invention.

FIG. 1 is a sectional view of read/write head 20 for use in a magnetic storage system. Head 20 includes inductive write device 22 and magneto-resistive (MR) read device 24. Inductive write device 22 includes coils 28 and pole pieces 26. Electric current is passed through coils 28 to generate a magnetic field. The magnetic field generated by coils 28 is guided, by pole pieces 26, towards a magnetic storage media (not shown) adjacent surface 23 for writing information onto that magnetic media.

MR read device 24 includes magneto-resistive element (MRE) 30, conductive paths 32 and shields 34. MRE 30 is typically a thin magneto-resistive film. As MR read device 24 passes through magnetic fields emanating from the adjacent magnetic storage media, the resistance of MRE 30 changes. In other words, the resistance of MRE 30 is dependent upon nearby magnetic fields.

A predetermined current is supplied through conductive paths 32 and MRE 30. Although not fully shown in FIG. 1, conductive paths 32 provide a path for current to flow to MRE 30 and a path for current to flow from MRE 30. As the resistance of MRE 30 changes while MR read device 24 passes through varying magnetic fields, a change of voltage across conductive paths 32 is sensed as well. Therefore, by monitoring changes in voltage across conductive paths 32, data stored on the magnetic storage media may be read. Alternatively, instead of passing a predetermined current through conductive paths 32 and MRE 30, a constant voltage can be applied across paths 32 so that changes in resistance of MRE 30 cause changes in current flowing through paths 32. In this instance, data may be read by monitoring changes in current flowing through paths 32 and MRE 30.

MRE 30 may be fabricated from a large number of materials which exhibit magneto-resistive properties. A common material used in the fabrication of MRE 30 is permalloy, which is an alloy consisting of a combination of nickel and iron. Permalloy therefore has an atomic composition of $Ni_xFe_{1-x}$. Permalloy with 81% nickel and 19% iron ($Ni_{81}Fe_{19}$) is very commonly used in magnetic thin films. However, permalloy can contain any number of combinations of nickel and iron. In fact, a great number of nickel-iron alloys are know, with most containing between 30% and 86% nickel. The present invention is net limited to permalloy with any particular percentage of nickel, but rather to apply to permalloy films in general.

B. Ion-Beam Deposition of Permalloy Films

Figure 2:
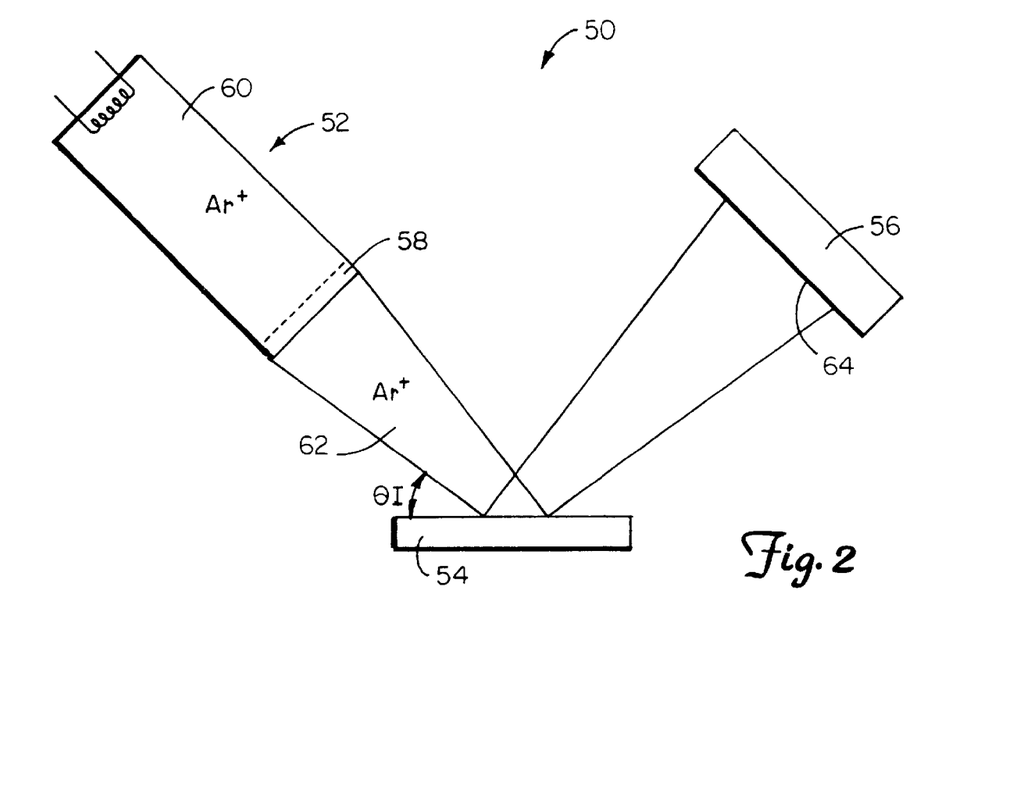
FIG. 2 is a diagrammatic view of an ion-beam sputtering system which may be used in accordance with the present invention.

FIG. 2 is a diagrammatic view of an ions sputtering deposition system for creating a thin magnetic film on a substrate in accordance with the present invention. Ion-beam sputtering deposition system 50 includes deposition gun 52, target 54, and substrate 56. Deposition gun 52 includes electrostatic lens or acceleration grid 58 and plasma generation region 60. In plasma generation region 60, a plasma discharge is created which is essentially a cloud of positively charged argon ions. In preferred embodiments of the present invention, the positively charged ions are argon ions. A negative voltage potential is applied to acceleration grid 58 to accelerate the argon ions and direct beam 62 of argon ions towards target 54. The voltage potential applied to acceleration grid 58 controls the energies of the argon ions that make up beam 62. As a result, the energies of the ions in beam 62 are very uniform.

In ion-bean sputtering deposition system 50 used in conjunction with preferred embodiments of the present invention, target 54 is located approximately 45 cm (18 inches) from deposition gun 52. However, in other embodiments, the distance between target 54 and deposition gun 52 may vary.

In preferred embodiments of the present invention, target 54 is composed of permalloy. Although in some preferred embodiments of the present invention, permalloy with an atomic composition of approximately 81% nickel and 19% iron is used for target 54, in other embodiments, permalloy with varying ratios of nickel and iron can be used.

Argon ions from ion-beam 62 collide with the surface of target 54. As a result, one or more nickel and/or iron atoms is knocked off of target 54 by each argon ion in ion-beam 62. Nickel and iron atoms, knocked off of target 54. then collect and condense on a surface of substrate 56 to form permalloy film 64.

Because ion-beam sputtering uses lower pressures compared to rf-diode sputtering, argon ions in ion-beam 62 collide with fewer gas molecules before striking target 54. As a result, argon ions colliding with the surface of target 54 have more energy. Consequently, nickel and iron atoms, which are sputtered from target 54 and collect and condense to form permalloy film 64 on substrate 56, also contain more energy. Additionally, some of the high energy argon ions from ion-beam 62 also bounce off target 54 and bombard film 64 at is grows, thus providing additional energy to film 64 as it forms.

The voltage applied to acceleration grid 58 is frequently referred to as the beam energy or beam voltage. The beam energy can be increased or decreased to alter the film deposition rate. Increasing the beam energy results in an increased film deposition rate. Likewise, decreasing the beam energy results in a decrease in the film deposition rate. Additionally, the magnetic and electrical properties of permalloy film 64 may be altered by increasing and decreasing the beam energy.

Target 54 may be rotated or pivoted such that the angle between ion-beam 62 and target 54, referred to here as angle of incidence $\Theta_1$, may be varied. By varying angle of incidence $\Theta_1$, the magnetic properties of permalloy film 64 on substrate 56, which is maintained in a direction substantially parallel to the direction of ion-beam 62, may be altered. Additionally, the deposition rate may decrease as $\Theta_1$ increases.

C. Crystal Growth in the FCC <111> Plane

Figure 3:
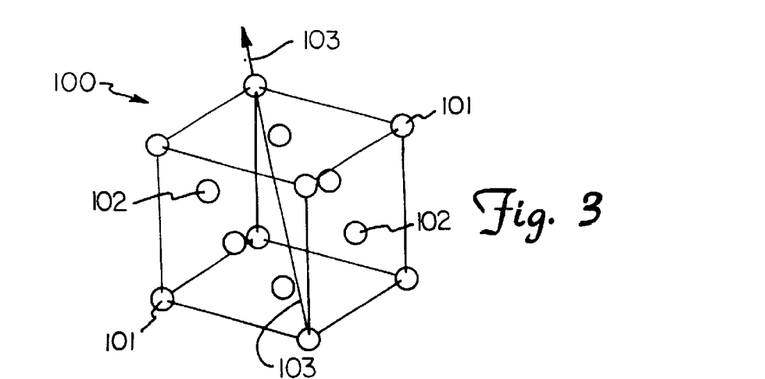
FIG. 3 is a diagrammatic view of a face centered cubic unit cell.

FIG. 3 is a perspective view of face centered cubic (FCC) unit cell 100. FCC unit cell 100 is a common molecular structure in thin films. In a perfect crystal lattice, each FCC unit cell 100 would have an atom 101 at every corner of the cube as well as an atom 102 centered in the plane of each of the cube's six sides or faces. Planes or directions of crystal growth can be defined along the axes of FCC unit cell 100. For example, line segment 103 represents the FCC <111> plane. Nickel films have a tendency to grow crystallographically in the direction of the FCC <111> plane, with the FCC <111> plane lying parallel to the surface of the substrate on which the film grows.

In general, the higher the degree of crystallinity along the FCC <111> plane, the longer the range of atomic ordering of a film. The degree of crystallinity of any given film in the FCC <111> plane may be determined by several methods. A very common method of determining the degree of crystallinity of a film in the FCC <111> plane is to perform an x-ray diffraction analysis. The intensity or magnitude of the resulting FCC <111> x-ray diffraction peak is dependent upon the degree of crystallinity in the FCC <111> plane within individual grains, upon grain size, and upon film thickness. For a given film thickness, the higher the degree of crystallinity or the longer the range of atomic ordering of the film in the FCC <111> plane, the higher the intensity of the x-ray diffraction peak. Likewise, the lower the degree of crystallinity or the shorter the range of atomic ordering along the FCC <111> plane, the lower the intensity of the x-ray diffraction peak.

Based upon the conditions under which films are grown, the properties of the film, particularly the magnetic properties, can be altered considerably. Typically, both rf-diode sputtered and ion-beam sputtered permalloy films have a polycrystalline structure. In many instances, prior art permalloy thin films were heated to make them even more crystalline in order to change their magnetic and electric properties.

D. Grain Size

Grain size is an ordering factor in films. Even though a crystalline atomic ordering may exist to some degree in a film, as the grain size decreases. it is quite possible that the long range atomic ordering will decrease as well. If the grains of the permalloy film are too small, resistivity can become prohibitively high. This factor will be discussed later in greater detail. In many circumstances, optimal characteristics of a film include high output amplitudes and low resistivity. As will be discussed shortly, output amplitudes are typically considered to be a function of a films Delta-Rho.

E. Amorphous Films

Amorphism is defined as the non-crystalline condition of a solid substance due to an irregular molecular assembly. For a completely amorphous film in the FCC <111> plane, indicating absolutely no crystallinity along the FCC <111> plane, no FCC <111> x-ray diffraction peak would exist for the film. In other words, the FCC <111> x-ray diffraction peak would equal zero.

However, substances can rarely be found which are completely amorphous in the FCC <111> plane and which would therefore exhibit absolutely no FCC <111> x-ray diffraction peaks. Yet, a number of materials are considered to be amorphous materials. In magnetic thin film terminology, thin film materials with very low FCC <111> x-ray diffraction peaks are considered amorphous, nearly amorphous, or essentially amorphous. Whether or not a film's FCC <111> x-ray diffraction peak is low enough for the film to be considered amorphous or nearly amorphous can be determined by comparing the magnitude of the film's peak to FCC <111> x-ray diffraction peaks of non-amorphous films with similar thicknesses and compositions. An alternative method of determining the degree of amorphism of a thin film is to use electron microscopy techniques to determine the long range atomic ordering of the film. However, this technique can be very expensive and requires special equipment.

E. TEST CONDITIONS AND RESULTS

For tests upon which the present invention is at least partially based, ion-beam sputtering was used to deposit thin film permalloy MREs on 3" diameter silicon wafers. Each wafer holds many individual MREs. A dual gun ion-beam sputtering system was used to deposit the permalloy MREs, with an atomic composition of $Ni_{81}Fe_{19}$(81/19 permalloy), on the wafers. The ion-beam sputtering system directed a beam of positively charged argon ions at a target composed of 81/19 permalloy. Both the ion-beam energy level and angle of incidence $\Theta_1$ of the ion-beam with respect to the target were varied. The angle of incidence was varied between two positions, 30° and 90° (or normal). The ion-beam energy levels were varied between three energy levels: 300, 500 and 1,000 electron-volts.

As mentioned above, higher ion-beam energy levels or beam voltages produced faster deposition rates as well as more energetic bombardment of the deposited films by argon ions and neutrals which were reflected from the sputtering target. After the MRE depositions using the above described ion-beam sputtering conditions, the wafers were fabricated following a standard build process. Tests were then performed to compare the ion-beam sputtered MRE wafers, fabricated with varying beam energies and angles of incidences, to one another and to two types of standard rf-diode sputter deposited wafers, rigid disc and a second design.

Table I summarises the measured electrical and magnetic properties of the MRE films on the ion-beam sputtered MRE wafers and on the rf-diode sputtered MRE wafers. As can be seen in Table I, the ion-beam sputtered MRE films sputtered with an angle of incidence $\Theta_I$ of 90° (normal incidence) had beam energies of either 500 or 1,000 electron-volts. The ion-beam sputtered MRE films sputtered with an angle of incidence $\Theta_I$ of 30° had beam energies of 300, 500 and 1,000 electron-volts. The thickness, in angstroms, of the various MREs is also shown in Table I.

sputtered permalloy MREs. Consequently, conventional wisdom in the art is that, in most cases, the larger the Delta Rho of the film, the higher the change in output amplitude of the MRE as it passes through a magnetic field.

Once again, under conventional MRE thin film design theories, the large the Delta-Rho, the better the thin film MRE material. Under this conventional belief, the results shown in Table I indicate that ion-beam sputtered permalloy MRE films sputtered with an angle of incidence $\Theta_I$ of 90° and a beam energy of 1,000 electron volts would be the best of the ion-beam sputtered permalloy MRE film materials. However, the rigid disc rf-diode permalloy MRE film would be considered the best overall permalloy MRE material.

Coercivity $H_c$ of the various MREs is also shown in Table I. Coercivity in a magnetic material is an important factor in determining how easily the magnetic material may be magnetised. Coercivity $H_c$ is sometimes defined as the magnetic field strength necessary to reduce the flux density back to zero after the film has been magnetised. However, it should be noted that other definitions of coercivity $H_c$ are recognised as well. As can be seen from Table I, all of the MREs have very low coercivity, with the highest being around 135 $Am^{-1}$ (1.7 oersted). The lowest coercivity, found in MREs with ion-beam sputtered permalloy films fabricated with an angle of incidence of $\Theta_I$ of 30° and a beam energy of either 300 or 1,000 electron-volts, was 103 $Am^{-1}$ (1.3 oersteds).

Tables II and III summarise the results of amplitude and noise tests run on MREs from seven sample MRE wafers. Table II illustrates the digital test wafer level results for these MREs. Table III illustrates the digital test wafer level results for these MREs. Table III illustrates the analog test wafer level results for these MREs. Bias currents in the digital and analog tests were set at a level which would minimise second harmonics.

All of the ion-beam sputtered MRE wafers tested to obtain the data shown in Tables II and III were sputtered

TABLE 1

| | rf Diode Sputtered MREs | | IONBEAM SPUTTERED MREs | | | |
|---|---|---|---|---|---|---|
| | | Second | Normal Incidence | | 30 Degree Incidence | | |
| | Rigid Disc | Design | 500 V | 1000 V | 300 V | 500 V | 1000 V |
| Thickness ($10^{-10}$ m) | 340* | 350 | 230 | 370 | 440 | 435 | 360 |
| Flux (nwb) | 2.7 | 2.7 | 2.2 | 2.8 | 4.0 | 3.6 | 3.9 |
| $10^{-10}$ m/nwb | 126 | 130 | 105 | 132 | 112 | 121 | 94 |
| Hc ($Am^{-1}$)[Oe] | 111 [1.4] | 135 [1.7] | 135 [1.7] | 111 [1.4] | 103 [1.3] | 111 [1.4] | 103 [1.3] |
| Hk ($Am^{-1}$)[Oe] | 302 [3.8] | 279 [3.5] | 279 [3.5] | 310 [3.9] | 255 [3.2] | 271 [3.4] | 279 [3.5] |
| Lambda ($\times 10^{-6}$) | .1–.2 | N/A | N/A | N/A | .50 | .57 | .50 |
| Alpha 90 (deg.) | 5.5 | N/A | 14.5 | 11.0 | 12.5 | 9.0 | 9.5 |
| R | 1.72 | 1.88 | 3.02 | 2.37 | 1.78 | 1.95 | 2.22 |
| dR/R | 2.64 | 2.15 | 1.68 | 1.62 | 1.52 | 1.51 | 1.02 |
| Rho (u-ohm-cm) | 22.8 | 25.6 | 28.1 | 32.6 | 30.5 | 33.1 | 31.2 |
| Delta Rho | .602 | .550 | .472 | .528 | .500 | .464 | .318 |

*Estimated thickness

One measure of the quality of a permalloy thin film as an MRE is the film's Delta-Rho, which is the change in resistance exhibited by the film when placed in a magnetic field as compared to the resistance of the film when no magnetic field is present. From Table I, it appears that overall, ion-beam sputtered permalloy MRE films have lower Delta-Rhos than standard rf-diode sputtered permalloy MRE films. In this respect, it would initially appear that rf-diode sputtered permalloy MREs are superior to ion-beam with an angle of incidence $\Theta_I$ of 30°. Wafers 1 and 2 are ion-beam sputtered permalloy MRE wafers sputtered with an ion-beam energy of 500 electron-volts. Wafers 3 and 4 are ion-beam sputtered permalloy MRE wafers sputtered with an ion-beam energy of 1,000 electron-volts. Wafers 5 and 6 are ion-beam sputtered permalloy MRE wafers sputtered with an ion-beam energy of 300 electron-volts. Wafer 7 is not a single wafer, but instead represents the average test result values from 100 rf-diode sputtered MRE wafers.

TABLE II

DIGITAL

| WAFER NUMBER | ANGLE OF INCIDENCE (degrees) | IONBEAM ENERGY (eV) | MRE THCK. (×10⁻¹⁰ m) | AMP (uV) | NOISE (dB) | 2nd Har. (dB) | MR Res (ohm) |
|---|---|---|---|---|---|---|---|
| 1 | 30 | 500 | 435 | 801 | −46.1 | −46.8 | 55 |
| 2 | 30 | 500 | 435 | 776 | −45.5 | −43.3 | 53 |
| 3 | 30 | 1000 | 360 | 796 | −42.9 | −44.1 | 61 |
| 4 | 30 | 1000 | 360 | 872 | −43.3 | −40.5 | 52 |
| 5 | 30 | 300 | 440 | 1054 | −49.5 | −48.8 | 51 |
| 6 | 30 | 300 | 440 | 1164 | −48.9 | −47.1 | 52 |
| 7 | — | — | 340 | 820 | 48.2 | −45.4 | 59 |

TABLE III

ANALOG

| WAFER NUMBER | ANGLE OF INCIDENCE (degrees) | IONBEAM ENERGY (eV) | MRE THCK. (×10⁻¹⁰ m) | AMP (uV) | NOISE (dB) | 2nd Har. (dB) | MR Res (ohm) |
|---|---|---|---|---|---|---|---|
| 1 | 30 | 500 | 435 | 2447 | −50.5 | −43.4 | 269 |
| 2 | 30 | 500 | 435 | 2351 | −50.6 | −42.5 | 258 |
| 3 | 30 | 1000 | 360 | 2149 | −45.9 | −41.6 | 315 |
| 4 | 30 | 1000 | 360 | 1990 | −48.4 | −43.1 | 256 |
| 5 | 30 | 300 | 440 | 3663 | −53.1 | −48.7 | 249 |
| 6 | 30 | 300 | 440 | 4146 | −52.4 | −48.5 | 261 |
| 7 | — | — | 340 | 3119 | −50.1 | −41.8 | 257 |

As can be seem from Table II, MREs from ion-beam sputtered wafers 1–4 have similar digital output amplitudes to MREs from rf-diode sputtered wafer 7. The digital output amplitude of MREs from wafers 1–4 range from 776 microvolts to 872 microvolts. This result is fairly consistent with the similar Delta Rho values exhibited by MREs from wafers 1–4 as was shown in Table I. On average, wafers 1 and 2, which were sputtered with an ion-beam energy of 500 electron-volts, exhibited slightly lower digital output amplitudes than wafers 3 and 4, which were sputtered with an ion-beam energy of 1,000 electron-volts.

Table II also shows that MREs from wafers 5 and 6, which correspond to permalloy films sputtered with a beam energy of 300 electron-volts, have significantly higher digital output amplitudes than either the MREs from standard rf-diode sputtered MRE wafer 7 or than other MREs from ion-beam sputtered MRE wafers 1–4. The MREs on wafer 5 had a digital output amplitude of 1054 microvolts, while the MREs on wafer 6 had a digital output amplitude of 1164 microvolts. These results show an improvement of between 36 and 50 percent over the digital output amplitude of MREs from wafer 2, which had the lowest output of all MRE wafers tested. These results show an improvement of between 21 and 33 percent over the digital output amplitude of MREs from wafer 4, which had the highest output of the remaining ion-beam sputtered MRE wafers. Finally, these results show an improvement of between 29 and 42 percent over the digital output amplitude of MREs from rf-diode sputtered MRE wafer 7.

Similar results for analog amplitude tests are shown in Table III. The 3,663 microvolt and 4,146 microvolt analog output amplitudes of wafers 5 and 6 once again far exceeded the outputs of MREs from wafers 1–4 and 7. The analog output amplitudes of MREs from wafers 5 and 6 were between 84 and 108 percent higher than the 1,990 microvolt analog output amplitude of MREs from wafer 4, which had the lowest output of the tested MRE wafers. The analog output amplitude of MREs from wafers 5 and 6 were between 50 and 69 percent higher than the 2,447 microvolt analog output amplitude of MREs from wafer 1, which had the highest of the remaining ion-beam sputtered MRE output amplitudes. Finally, the outputs of wafers 5 and 6 were between 17 and 33 percent higher than the 3,119 microvolt analog output amplitude of MREs from rf-diode sputtered wafer 7.

As discussed, Tables II and III show the somewhat unexpected result of MREs from wafers 5 and 6 having significantly higher analog and digital output amplitudes than outputs of MREs from either standard rf-diode sputtered MRE wafer 7 or MREs from ion-beam sputtered MRE wafers 1–4. Tables II and III also show that MREs from wafers 5 and 6 exhibit greatly improved second harmonics and noise characteristics as compared to MREs from wafers 1–4 and 7. Again, these results are surprising when considered with the fact that MREs from wafers 1–7 all exhibited some other very similar magnetic and electrical properties. Wafers 5 and 6, which correspond to the MREs deposited with an ion-beam energy level (300 eV) that produced one of the lowest Delta Rhos, would not normally be expected to contain MREs with the highest output amplitudes. Examination of wafers 5 and 6 revealed no significant process deviations from the build specifications applied to the other wafers which could account for the observed improvements in performance.

Figure 4:
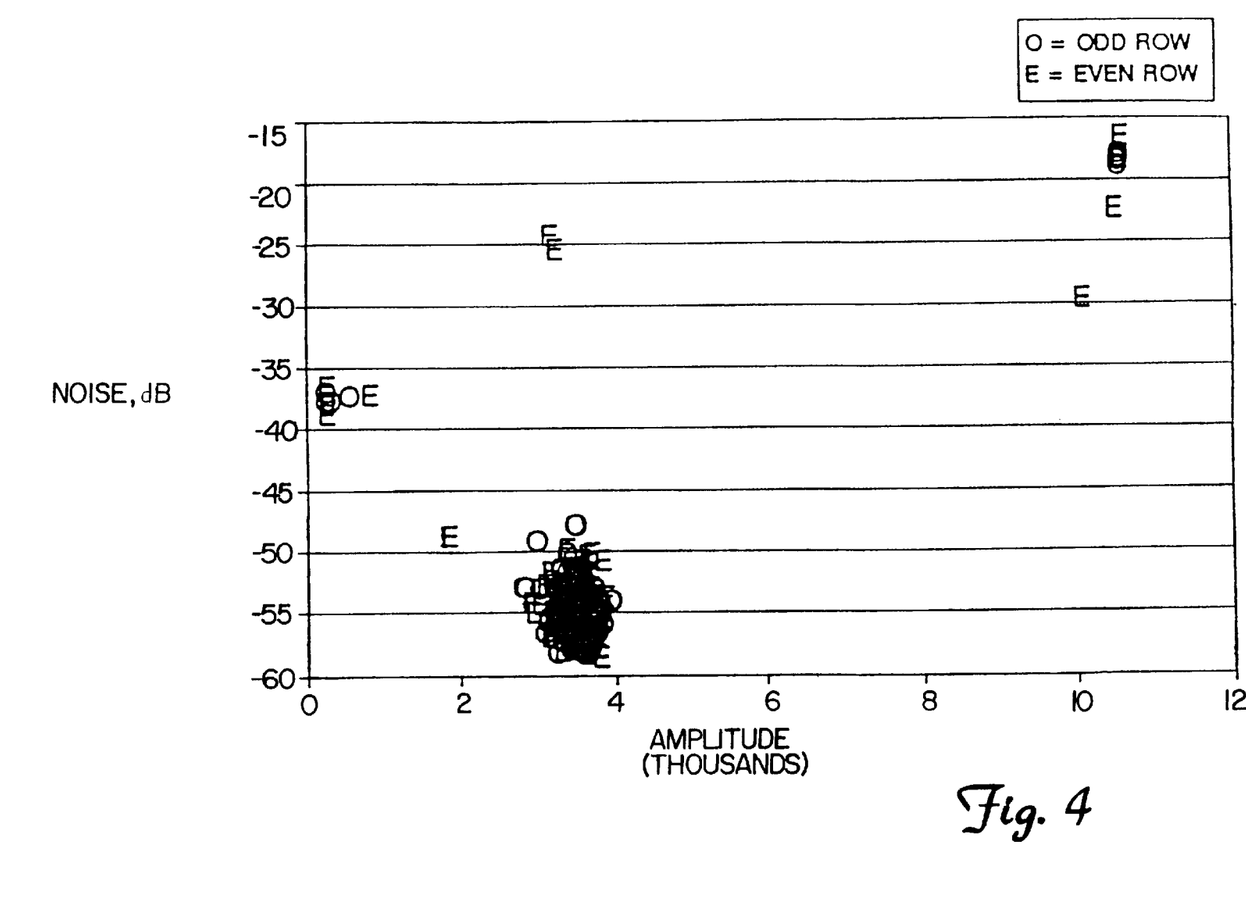
FIGS. 4 and 5 are graphs illustrating output amplitude versus noise characteristics of permalloy films with substantially amorphous crystalline structures in accordance with the present invention.
Figure 5:
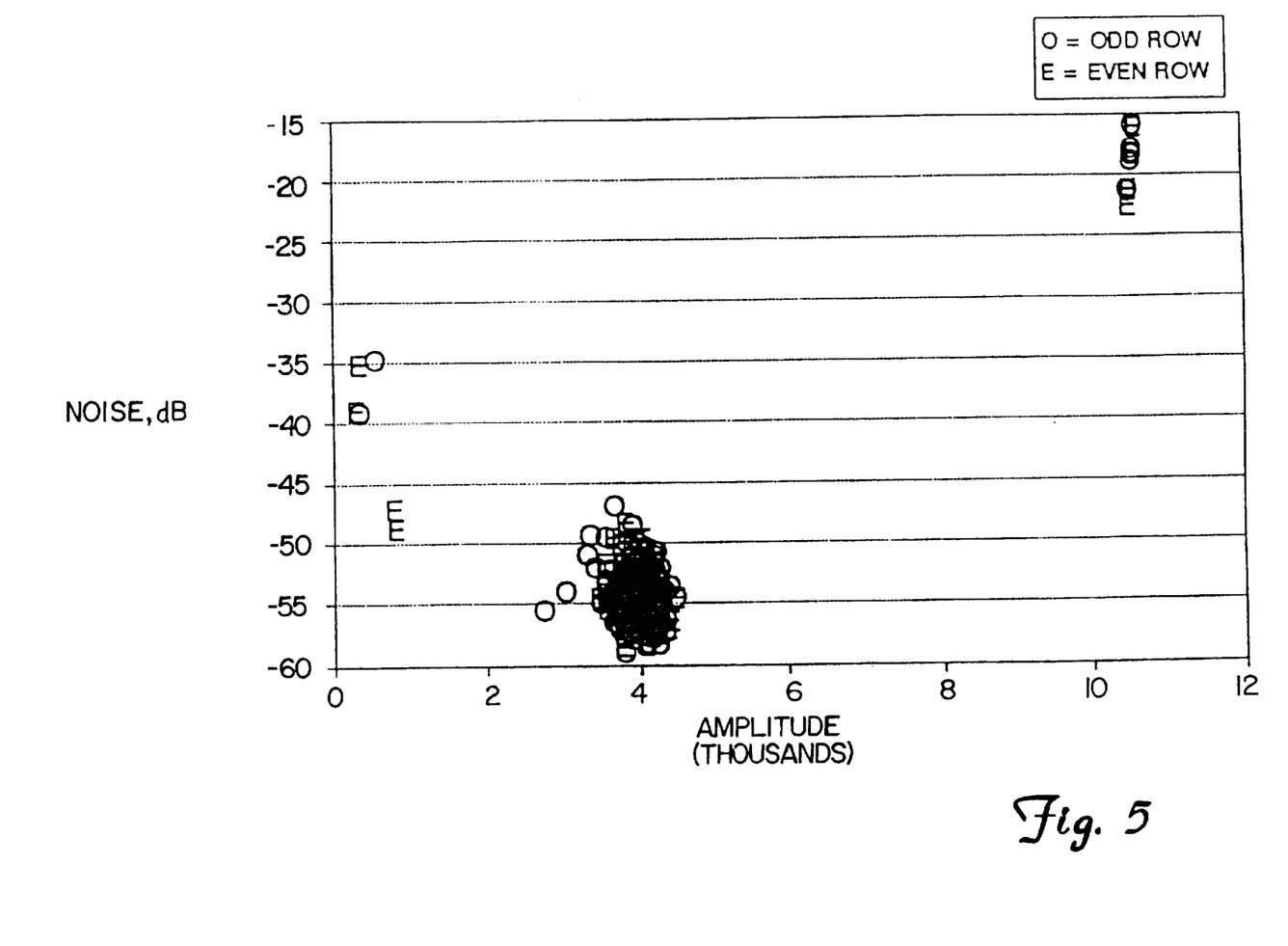
Figure 6:
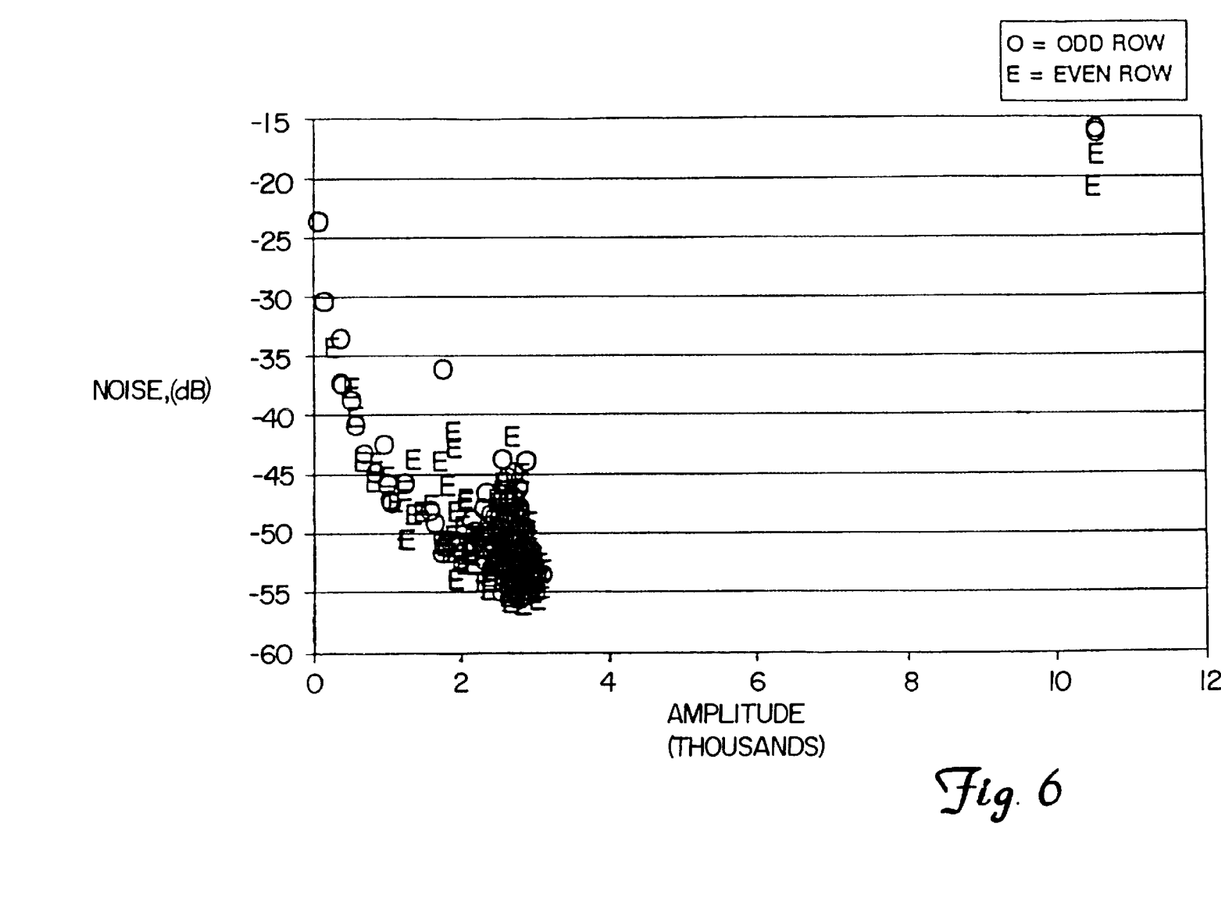
FIG. 6 is a graph illustrating output amplitude versus noise characteristics of an rf-diode sputtered permalloy film.

FIGS. 4–6 illustrate noise versus analog output amplitudes for various wafers. FIG. 4 illustrates the analog output amplitude versus noise characteristics for wafer 5. Once again, wafer 5 contains MREs with ion-beam sputtered permalloy films fabricated using an ion-beam energy of 300 electron-volts and an angle of incidence $\Theta_I$ of 30°. FIG. 5 illustrates analog output amplitude versus noise characteristics for wafer 6. Once again, wafer 6 contains MREs with ion-beam sputtered permalloy films fabricated using an ion-beam energy of 300 electron-volts and an angle of incidence $\Theta_I$ of 30°. FIG. 6 illustrates the analog output amplitude versus noise characteristics for a randomly selected wafer fabricated using a standard rf-diode sputtering process. As can be seen from FIGS. 4–6, each wafer contains numerous MREs, with the noise versus amplitude data point for each MRE represented by either an E or an O. The highest amplitude and noise data points are probably a result of a short in a test sensor during testing.

As can be seen from FIGS. 4 and 5, ion-beam sputtered wafers 5 and 6 contain MREs with superior amplitude versus noise characteristics as compared to MREs from the standard rf-diode sputtered wafer shown in FIG. 6. Additionally, it can be seen from FIGS. 4–6, that the amplitude versus noise characteristics exhibited by MREs from wafers 5 and 6 are much more uniform as compared to the amplitude versus noise characteristics of MREs from the rf-diode sputtered wafer shown in FIG. 6. This is likely due to the fact that, unlike rf-diode sputtering, ion-beam sputtering does not provide a dense plasma near the location of the substrate. This in turn limits plasma interactions with the aligning magnetic field and minimizes thickness variations due to this effect. The more uniform distribution exhibited by ion-beam sputtered MREs over rf-diode sputtered MREs is another advantage of ion-beam sputtering. Non-uniformity of rf-diode sputtered MREs commonly results in excess production costs and waste as many wafers must be discarded.

Considering the other somewhat similar magnetic and electrical properties of wafers 1–7 as shown in Table I, the improved amplitude, noise, second harmonics and uniformity of the 300 electron-volt ion-beam sputtered MREs from wafers 5 and 6 are interesting results. In an effort to explain the improved characteristics of wafers 5 and 6, an x-ray diffraction analysis was conducted on wafers 1–7. The results of the x-ray diffraction analysis, which are shown in Table IV, provide insight into the causes behind the improved characteristics of these wafers.

with an ion-beam energy of 500 electron-volts, exhibited the next highest FCC <111> x-ray diffraction peak. The 1,631 counts per second peak intensity of these wafers indicates reduced, yet clearly existent, crystallinity and long range atomic ordering in the FCC <111> plane. MREs from ion-beam sputtered wafers 3 and 4, with an ion-beam energy of 1,000 electron-volts, exhibited an FCC <111> x-ray diffraction peak of 863 counts per second, half of that exhibited by ion-beam sputtered wafers 1 and 2. However. compared to the x-ray diffraction peaks of wafers 5 and 6, the MRE films of wafers 3 and 4 would still be considered to be essentially crystalline in structure. All of the x-ray diffraction peaks occur around 44° diffraction angle for copper alpha radiation.

It must be noted that MREs from ion-beam sputtered wafers 3 and 4 were considerably thinner than MREs from the other wafers. When considered with the previously mentioned fact that the intensity of the FCC <111> x-ray diffraction peak is partially based upon film thickness, it will be recognized that the FCC <111> x-ray diffraction peak of 863 exhibited by MREs from wafers 3 and 4 would be even higher if these films were as thick as other tested films. This further illustrates the reduced degree of crystallinity of MREs from wafers 5 and 6.

The most significant result of the test is the FCC <111> x-ray diffraction peak of MREs from ion-beam sputtered wafers 5 and 6. These MRE wafers, with MREs sputtered with an ion-beam energy of 300 electron-volts, exhibited an FCC <111> x-ray diffraction peak intensity of only 26 counts per second. This FCC <111> x-ray diffraction peak is more than 33 times lower than that of wafers 3 and 4, the wafers with the next lowest peak intensity. If wafers 3 and 4 were the same thickness as wafers 5 and 6, the corresponding FCC <111> x-ray diffraction peak would be more than 33 times lower than that of wafers 3 and 4. This result is also more than 208 times lower than that of rf-diode sputtered wafer 7.

The 26 count per second FCC <111> x-ray diffraction peak intensity of MREs on wafers 5 and 6 indicates an amorphous, substantially amorphous, nearly amorphous, or essentially amorphous permalloy crystalline film structure oriented in the plane of the substrate. When considered with the fact that all of wafers 1–7 had similar thicknesses, this result leads to the conclusion that ion-beam sputtered MREs

TABLE IV

COMPARISON OF X-RAY FOR ION BEAM AND STANDARD rf SPUTTERED MREs

| WAFER NUMBER | ANGLE OF INCIDENCE (degrees) | ION BEAM ENERGY (eV) | MRE THCK. ($\times 10^{-10}$ m) | 2-THETA <111> PEAK POSITION (degrees) | <111> PEAK INTENSITY (CPS) | GRAIN SIZE SIZE ($\times 10^{-10}$ m) |
|---|---|---|---|---|---|---|
| 1,2 | 30 | 500 | 435 | 44.085 | 1631 | 196 |
| 3,4 | 30 | 1000 | 360 | 43.979 | 863 | 169 |
| 5,6 | 30 | 300 | 440 | 44.129 | 26 | 126 |
| 7 | — | — | 430 | 44.146 | 5425 | 226 |

As can be seen from Table IV, MREs from rf-diode sputtered MRE wafer 7 exhibited an FCC <111> x-ray diffraction peak of 5,425 counts per second, the highest of the tested wafers. This indicates that the rf-diode sputtered permalloy thin films on MRE wafer 7 have the highest degree of crystallinity and the longest range of atomic ordering. MREs from ion-beam sputtered wafers 1 and 2, fabricated with an ion-beam energy of 300 electron-volts and an angle of incidence $\Theta_I$ of 30° exhibit very little, and practically no, crystallinity along the FCC <111> plane. Alternatively, it can also be concluded that only very short range atomic ordering in the <111> plane is existent in these permalloy films. This alternative conclusion is discussed below in greater detail. Although no electron microscopy techniques were used to analyse the permalloy MRE films, it is speculated that reduced atomic ordering would be found.

It is also shown in Table IV that grain size of permalloy films on wafers 5 and 6 were significantly smaller than grain sizes of permalloy films on wafers 1–4 and 7. The permalloy films with substantially amorphous crystalline structures from wafers 5 and 6 has a grain size of $126 \times 10^{-10}$ m (Angstroms). The permalloy films from wafers 3 and 4 had a grain size of $169 \times 10^{-10}$ m. The permalloy films from wafers 1 and 2 had a grain size of $196 \times 10^{-10}$ m. Finally, the permalloy films from wafer 7, which were the most crystalline of the films as is evidenced by their high FCC <111> x-ray diffraction peak intensity of 5,425 counts per second, had a grain size of $226 \times 10^{-10}$ m.

It is speculated that the reduced grain size exhibited by wafers 5 and 6 contributes substantially to the greatly reduced crystallinity found in these wafers. Grain size affects long range atomic ordering. As grain size decreases, long range atomic ordering decreases as well. The relationship between grain size and atomic ordering is such that within individual grains, an atomic ordering which would be considered crystalline may exist while, at the same time, reduced grain size can have the effect of reducing the long range atomic ordering of the film. Therefore, reduced long range atomic ordering as a result or reduced grain size translates to a reduced overall crystalline structure of the film as well. This is further evidence by the fact that, for permalloy films on wafers 1–7, as grain size increased, so did the FCC <111> x-ray diffraction peak. Consequently, permalloy films on wafers 5 and 6 can be described as having a reduced grain size which contributes to the substantially amorphous crystalline structure of these films.

Although grain size appears to have a significant effect on the crystallinity of permalloy films, it is clear from the non-linear nature of the data in Table IV that the degree of crystallinity of a film is not necessarily directly proportional to the grain size of the film. For example, the FCC <111> x-ray diffraction peak of substantially amorphous wafers 5 and 6 is more than 33 times less than that of wafers 3 and 4, while the grain size of wafers 5 and 6 is only roughly 25 percent less than the grain size of wafers 3 and 4. Consequently, it is difficult to determine a specific size that results in a permalloy film which exhibits a substantially amorphous crystalline structure, like the substantially amorphous permalloy films of the present invention. However, it appears from the data in Table IV that a size of less than $169 \times 10^{-10}$ m is required.

As discussed earlier, an optimal property which can be exhibited by an MRE film is high output amplitudes. Under conventional theories, to increase output amplitudes, the film Delta-Rho had to be increased as well. In the films of the present invention with reduced grain size and a resulting amorphous or substantially amorphous crystalline structure, it was observed that these films exhibited substantially higher output amplitudes without exhibiting increased Delta-Rhos. It is once again speculated that this is due, in part, to the reduced grain size of the substantially amorphous MRE films on wafers 5 and 6.

Figure 7:
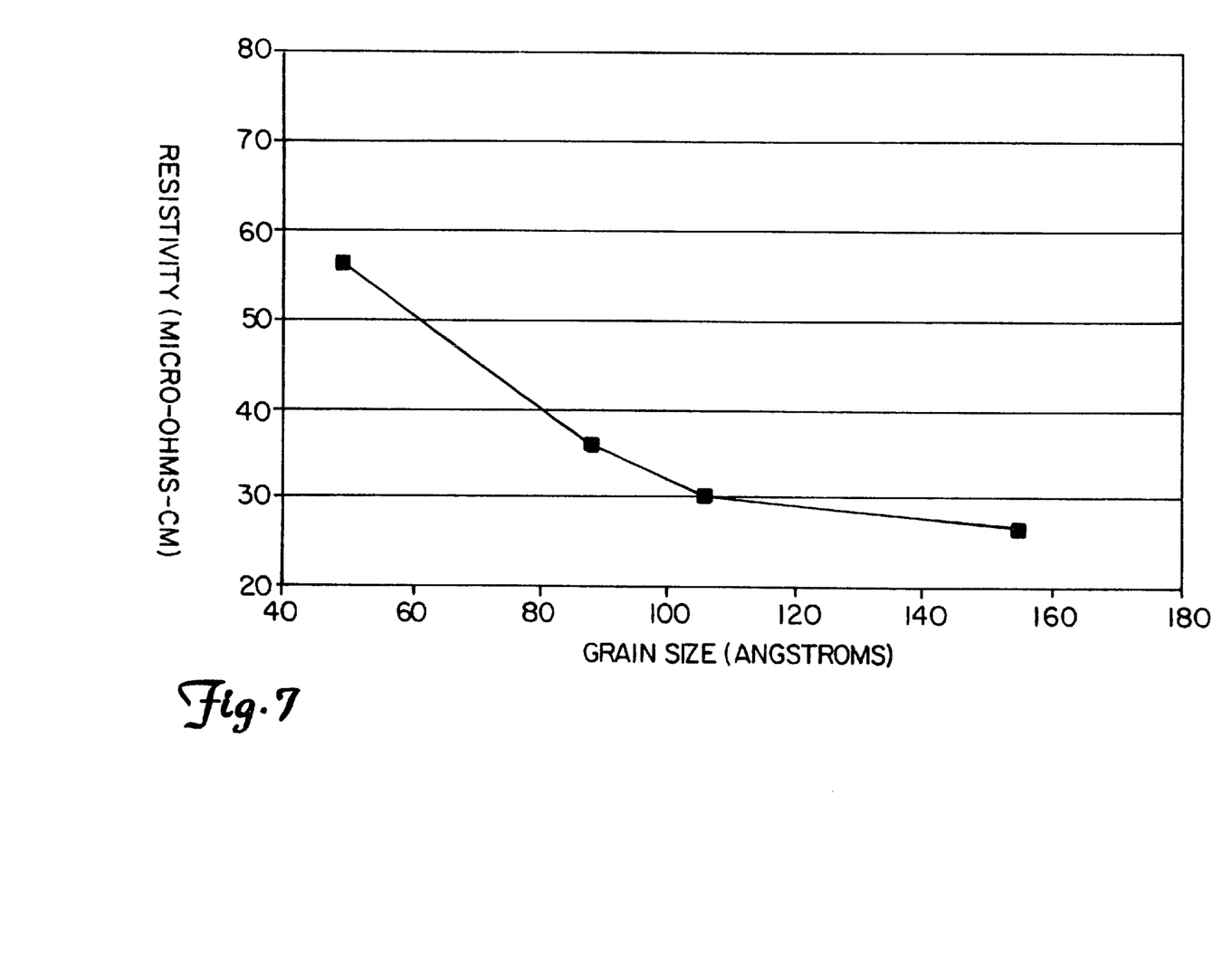
FIG. 7 is a graph showing resistivity versus grain size for a number of ion-beam sputtered permalloy films.

However, it should be noted that reduced grain size alone is not likely to account for all of the improved results obtained. The films of the present invention did not exhibit a significant increase in resistivity. FIG. 7 is a graph showing resistivity versus grain size of permalloy films. The data illustrated by FIG. 7 was taken from a number of ion-beam sputtered permalloy films sputtered with a beam energy of 300 electron-volts. The films were between 300 and $400 \times 10^{-10}$ m thick. As can be seen from FIG. 7, the resistivity of the films varied only slightly as the grain sizes were reduced from just below $160 \times 10^{-10}$ m to just above $100 \times 10^{-10}$ m. However, as the grain sizes were reduced much below about $100 \times 10^{-10}$ m, the resistivity increased much more rapidly. The resistivity corresponding to the smallest grain sizes detected are likely to be prohibitively high.

As discussed above, small gain size alone cannot account for the results obtained. Other techniques, such as rf-diode sputtering techniques, could in theory under extreme fabrication conditions, be used to obtain small grain sizes such as those obtained above. The extreme fabrication conditions necessary could include sputtering while cooling the substrate with a liquid coolant. These overly burdensome rf-diode sputtering conditions could possibly obtain reduced grain size, but not the desired combination of increased output amplitudes and low or normal resistivity as discovered in the permalloy films with substantially amorphous crystalline structures of the present invention. The increased output amplitudes observed in the permalloy films with substantially amorphous crystalline structures are speculated to be due, in part, to dense packing of the grains which is a result of the ion-beam sputtering process under certain conditions. If the grains of the films were not highly packed, resistivity would likely increase and output amplitudes would decrease as a result of less signal producing active sensor material being present per unit volume in the films.

Figure 8:
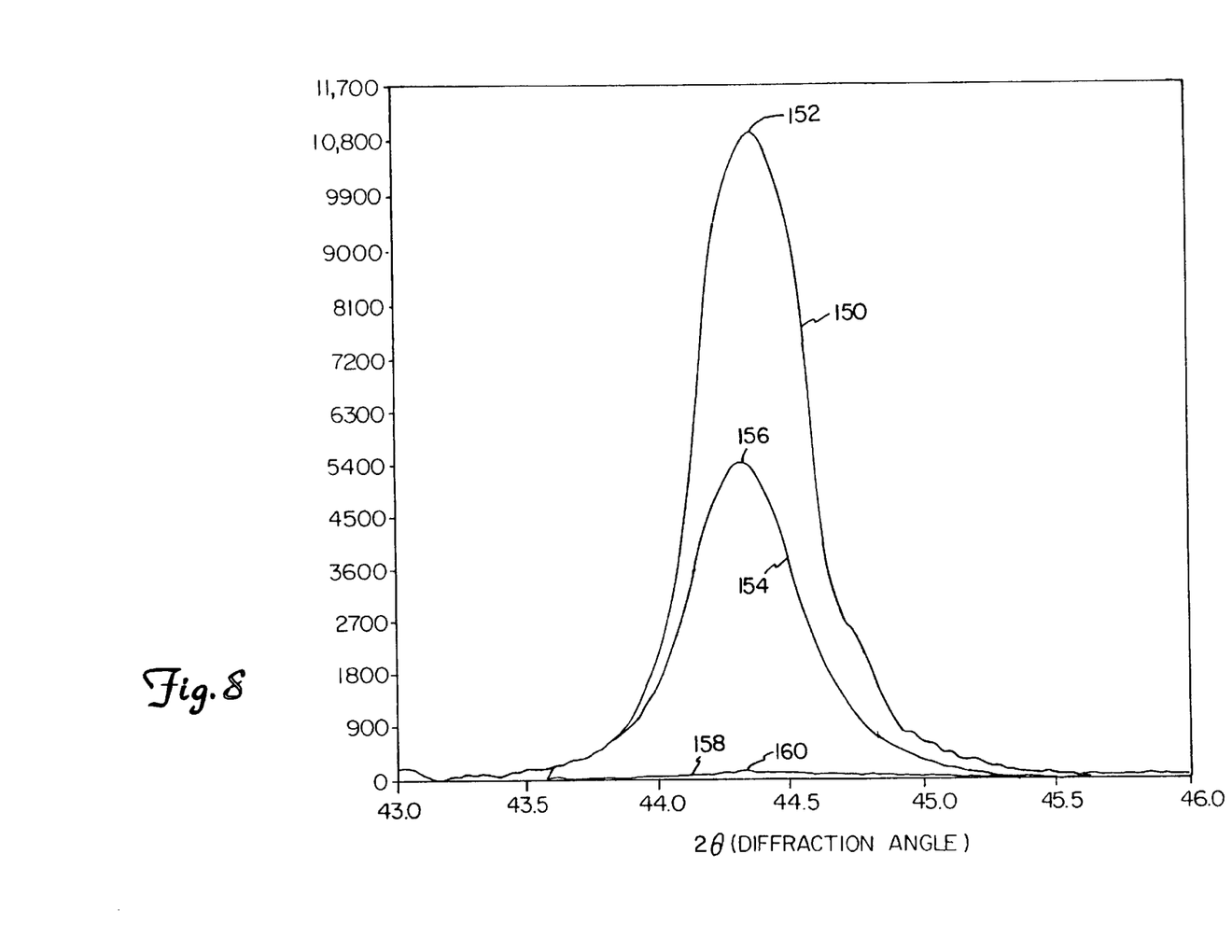
FIG. 8 is a graph showing the face centered cubic <111> x-ray diffraction peak of a permalloy film with a substantially amorphous crystalline structure showing FCC <111> x-ray diffraction peaks of two nonamorphous permalloy films.

FIG. 8 is a graph showing FCC <111> x-ray diffraction peaks of MREs from three selected MRE wafers. The three wafers were tested in order to verify the results shown in Tables I–IV. Curve 150, which has an FCC <111> x-ray diffraction peak 152 of approximately 11,000 counts per second, corresponds to a standard rf-diode sputtered MRE wafer. Curve 154, which has an FCC <111> x-ray diffraction peak 156 of 5,400 counts per second. corresponds to an ion-beam sputtered MRE wafer sputtered with an ion-beam energy of 500 electron-volts and an angle of incidence of $\Theta_I$ of 30°. By contrast, curve 158, which corresponds to an ion-beam sputtered MRE wafer sputtered with an ion-beam energy of 300 electron-volts and an angle of incidence $\Theta_I$ of 30°, has a peak intensity 160 of around 100 counts per second. Although peak 160 of curve 158 is somewhat higher than the 26 counts per second peak intensity of wafers 5 and 6 as shown in Table IV, it still represents a nearly amorphous film structure in comparison to the peaks of other tested wafers.

It is therefore clear, as evidenced by the x-ray diffraction analysis, that the techniques of the present invention for producing dense packed reduced grain size permalloy films results in films which exhibit an amorphous or substantially amorphous crystalline structure.

In addition to producing more active sensor material per unit volume, other possible explanations of why the amorphous or nearly amorphous MRE films from wafers 5 and 6 exhibited superior output amplitude and noise characteristics is that higher packing densities limits oxidation more than the lower packing densities of standard rf-diode deposition techniques. Additionally. as is the case with magneto-optic media, a more amorphous film structure may also limit intrinsic noise mechanisms such as grain boundary domain wall pinning. These factors may help explain the improved characteristics exhibited by the amorphous permalloy films discovered.

Although the present invention has been described with reference to preferred embodiments, workers skilled in the art will recognize that changes may be made in form and detail without departing from the spirit and scope of the invention. For example, the invention is intended to apply to amorphous permalloy films in general, and is not intended to be limited to amorphous permalloy films with a particular ratio of nickel and iron. Additionally, while ion-beam sputtering conditions of a beam energy level of 300 electron-volts and an angle of incidence $\Theta_I$ of 30° produced optimal results in the tests performed, the invention is not intended to be limited to amorphous or nearly amorphous permalloy films sputtered under these exact conditions. For example, it is apparent that ion-beam energy levels play a more important role in reducing the degree of crystallinity of ion-beam sputtered permalloy films than angle of incidence $\Theta_I$ does. Also, amorphous permalloy films are not likely to be unique to films deposited under these specific sputtering conditions. One skilled in the art will realize that the optimal beam energy and angle of incidence for producing the substantially amorphous films of the present invention will vary depending upon system design characteristics such as substrate to target spacing. Finally, while amorphous permalloy films have been shown in use as an element of an MR head, these films can be used in other applications as well. For instance. amorphous permalloy films can be used in devices such as magnetometers for detecting magnetic fields.

What is claimed is:

1. A magneto-resistive element comprising a permalloy film formed by ion-beam sputter depositing the permalloy film at an energy below 500 electron-volts, wherein the permalloy film has a grain size of less than 169 Angstroms and exhibits a face centered cubic <111> x-ray diffraction peak of less than about 100 counts per second.

2. The magneto-resistive element of claim 1, wherein the film has a film structure with a face centered cubic <111> plane lying substantially parallel to a surface of the film.

3. The magneto-resistive element of claim 1 wherein the ion beam comprises argon ions.

4. The magneto-resistive element of claim 1 wherein the ion beam is directed at an incident angle of about 30° degrees to the permalloy film.

5. The magneto-resistive element of claim 4 wherein the ion beam comprises argon ions.

6. A magneto-resistive head comprising:

a substrate;

a magneto-resistive sensor supported on the substrate for sensing a magnetic field, the magneto-resistive sensor comprising a permalloy film formed by ion-beam sputter depositing the permalloy film at an energy below 500 electron-volts, having a grain size of less than 169 Angstroms, and having a film structure with a face centered cubic <111> plane lying substantially parallel to a surface of the film, the permalloy film exhibiting a face centered cubic <111> x-ray diffraction peak of less than about 100 counts per second; and conductive paths coupled to the magneto-resistive sensor for coupling the magneto-resistive sensor to external circuitry.

7. The magneto-resistive head of claim 6, wherein the ion beam comprises argon ions.

8. The magneto-resistive head of claim 6, wherein the ion beam is directed at an incident angle of about 30° degrees to the permalloy film.

9. The magneto-resistive head of claim 8 wherein the ion beam comprises argon ions.

10. A process of forming a permalloy film on a substrate for a magneto-resistive head comprising:

ion-beam sputtering permalloy onto the substrate at an energy below 500 electron-volts to form a permalloy film having a grain size of less than 169 Angstroms, having a film structure with a face centered cubic <111> plane lying substantially parallel to a surface of the film, and exhibiting a face centered cubic <111> x-ray diffraction peak of less than about 100 counts per second.

11. The process of claim 10 wherein the ion-beam comprises argon ions.

12. The process of claim 10 wherein the ion-beam is directed at an incident angle of about 30° to the substrate.

13. The process of claim 12 wherein the ion-beam comprises argon ions.

14. A magneto-resistive head comprising:

a substrate;

a magneto-resistive sensor supported on the substrate for sensing a magnetic field, the magneto-resistive sensor comprising a permalloy film having a grain size of less than 169 Angstroms, the film exhibiting a digital amplitude greater than 872 microvolts, and a digital noise less than −48.2 decibels, the permalloy film having a film structure with a face centered cubic <111> plane lying substantially parallel to a surface of the film, and exhibiting a face centered cubic <111> x-ray diffraction peak of less than about 100 counts per second; and conductive paths coupled to the magneto-resistive sensor for coupling the magneto-resistive sensor to external circuitry.

15. A magneto-resistive head comprising:

a substrate;

a magneto-resistive sensor supported on the substrate for sensing a magnetic field, the magneto-resistive sensor comprising a permalloy film having a grain size of less than 169 Angstroms, the film exhibiting an analog amplitude greater than 3,119 microvolts, and an analog noise less than −50.1 decibels, the permalloy film having a film structure with a face centered cubic <111> plane lying substantially parallel to a surface of the film, and exhibiting a face centered cubic <111> x-ray diffraction peak of less than about 100 counts per second; and conductive paths coupled to the magneto-resistive sensor for coupling the magneto-resistive sensor to external circuitry.

* * * * *

UNITED STATES PATENT AND TRADEMARK OFFICE
CERTIFICATE OF CORRECTION

PATENT NO. : 6,416,880 B1
DATED : July 9, 2002
INVENTOR(S) : Mark S. Miller

It is certified that error appears in the above-identified patent and that said Letters Patent is hereby corrected as shown below:

Title page,
Item [56], References Cited, OTHER PUBLICATIONS, insert
-- H. Nose, "Spin Wave Resonance in Amorphous Thin Films",
in Magnetic Films, Vyshaya Shkola, Minsk, pp. 126-127 (1974).

K. Handrich and C. Kolb, "Amorphous Ferro-Ferromagnetic", M.
Mir, pg. 178 (1982).

A.A. Preobrazhensky and E.G. Bishard, "Magnetic Materials And
Elements", Vysshaya Shkola, pp. 139-140 (1986). --.

Column 4,
Line 51, delete "net", insert -- not --.
Line 58, delete "ions", insert -- ion beam --.

Column 8,
Line 67, delete "sputtered MRE wafers", insert -- sputtered head MRE wafers --.

Signed and Sealed this

Sixth Day of September, 2005

JON W. DUDAS
*Director of the United States Patent and Trademark Office*